(12) United States Patent
Folts et al.

(10) Patent No.: US 9,172,312 B2
(45) Date of Patent: Oct. 27, 2015

(54) REDUCING PHOTOVOLTAIC ARRAY VOLTAGE DURING INVERTER RE-ENABLEMENT

(75) Inventors: Douglas C. Folts, Baraboo, WI (US); Kleber V. C. Facchini, Waukesha, WI (US); Ajith H. Wijenayake, New Berlin, WI (US); Gary J. Bowers, Waunakee, WI (US)

(73) Assignee: American Superconductor Corporation, Devens, MA (US)

( * ) Notice: Subject to any disclaimer, the term of this patent is extended or adjusted under 35 U.S.C. 154(b) by 724 days.

(21) Appl. No.: 12/625,645

(22) Filed: Nov. 25, 2009

(65) Prior Publication Data

US 2010/0275966 A1    Nov. 4, 2010

(51) Int. Cl.
*H01L 31/042* (2014.01)
*H02M 7/5387* (2007.01)
*H02H 7/122* (2006.01)
*H01L 31/02* (2006.01)
*H02M 1/00* (2007.01)

(52) U.S. Cl.
CPC .......... *H02M 7/5387* (2013.01); *H02H 7/1222* (2013.01); *H01L 31/02021* (2013.01); *H02M 2001/007* (2013.01); *Y02E 10/56* (2013.01)

(58) Field of Classification Search
CPC ..................................................... H02H 7/1222

USPC .................................... 307/151; 136/291, 293
See application file for complete search history.

(56) References Cited

U.S. PATENT DOCUMENTS

| | | | |
|---|---|---|---|
| 4,333,136 A * | 6/1982 | Baker | 363/43 |
| 6,111,767 A | 8/2000 | Handleman | |
| 6,232,742 B1 * | 5/2001 | Wacknov et al. | 318/811 |
| 6,291,764 B1 * | 9/2001 | Ishida et al. | 322/2 R |
| 7,924,582 B2 * | 4/2011 | Muller et al. | 363/56.05 |
| 2001/0032664 A1 * | 10/2001 | Takehara et al. | 136/244 |
| 2004/0264225 A1 * | 12/2004 | Bhavaraju et al. | 363/120 |
| 2006/0249195 A1 * | 11/2006 | Taylor | 136/244 |
| 2008/0094867 A1 * | 4/2008 | Muller et al. | 363/56.05 |
| 2010/0275966 A1 * | 11/2010 | Folts et al. | 136/244 |
| 2010/0320842 A1 * | 12/2010 | Beck | 307/80 |
| 2011/0175662 A1 * | 7/2011 | Said El-Barbari et al. | 327/319 |

FOREIGN PATENT DOCUMENTS

| EP | 1870996 | 12/2007 |
|---|---|---|
| EP | 1870996 A1 * | 12/2007 |

OTHER PUBLICATIONS

Machine translation of EP1870996, provided via EPO website.*

* cited by examiner

*Primary Examiner* — Fritz M Fleming
(74) *Attorney, Agent, or Firm* — Occhiuti & Rohlicek LLP

(57) ABSTRACT

An apparatus for harvesting solar power includes a photovoltaic array for generating a DC voltage; a discharge circuit for causing the DC voltage to decay from a first value to a second value; and an inverter circuit for transforming an output voltage from the discharge circuit into an AC voltage.

18 Claims, 4 Drawing Sheets

REDUCING PHOTOVOLTAIC ARRAY VOLTAGE DURING INVERTER RE-ENABLEMENT

FIELD OF INVENTION

This invention relates to photovoltaic inverter systems, and in particular, to reducing the voltage provided by a photovoltaic array to an inverter during the inverter start-up sequence.

BACKGROUND

A photovoltaic array outputs DC voltage. This voltage depends on such factors as solar irradiance, temperature, and the electrical load presented to the array.

To be more commercially useful, one provides this DC voltage to a utility class solar photovoltaic inverter. The inverter converts the DC photovoltaic array output into an AC voltage, which is then stepped up with a transformer and provided to a typical AC utility grid. In addition, the inverter maintains a maximum power point tracker (MPPT) for causing the photovoltaic array to operate at its maximum power point.

Occasionally, the inverter may fail and require maintenance. Or an alarm may trip, and the inverter protections will have to be reset. In either case, the inverter is disabled, and therefore no longer interacts with the photovoltaic array. Once this occurs, the inverter no longer controls the load. As a result, the photovoltaic array's output DC voltage increases.

Eventually, the inverter must be re-enabled so that the photovoltaic array can be put back into service. A difficulty can arise, however, if the output voltage of the array is higher than the maximum operating voltage of the inverter's switching elements. This is particularly likely at cold ambient temperatures. In such cases, re-enabling the inverter may expose the switching elements to excessively high voltage, and thus cause them to fail.

Another problem arises when, at the time the inverter is to be re-enabled, the ambient air temperature is at or near the minimum operating temperature of the switching elements. This arises because as the temperature falls, the breakdown voltage associated with the switching elements also falls. For example, at −40° C., the breakdown voltage of a switching element may be 5%-15% below its breakdown voltage at 25° C.

One solution is to reduce the array's DC voltage output. However, the output voltage depends on factors that are difficult to control, such as solar irradiance and outdoor temperature. It is difficult to temporarily shield the array from the sun, or to change the outdoor temperature so that the inverter can be re-enabled.

A known way to safely re-enable the inverter is to wait until dark, or until the temperature rises sufficiently. However, this is often inconvenient both because of the delay, the resulting lost revenue from electricity production, and the need to employ personnel after normal working hours. Moreover, in extreme latitudes, where days are long, it may be weeks or months until the sky is dark enough to reduce the voltage sufficiently to re-enable the inverter. And at those times when the sky is dark for extended periods, it may be weeks or months before the temperature rises enough to safely re-enable the inverter.

SUMMARY

In one aspect, the invention features an apparatus for harvesting solar power. Such an apparatus includes a photovoltaic array for generating a DC voltage; a discharge circuit for causing the DC voltage to decay from a first value to a second value; and an inverter circuit for transforming an output voltage from the discharge circuit into an AC voltage.

In one embodiment, the apparatus includes a discharge resistor, and a discharge switch in series with the discharge resistor, with the discharge circuit being in parallel with the inverter circuit. Among these embodiments are those in which the discharge switch includes an IGBT and those in which the discharge switch has a voltage rating equal to the voltage rating of the inverter circuit. Also included among these embodiments are those in which the discharge resistor has a discharge resistance selected to minimize energy absorbed by the discharge resistor subject to the constraint that transient current ratings of the discharge resistor and the discharge switch not be exceeded. In yet other embodiments, a clamping diode is in parallel with the discharge resistor.

Another embodiment further includes a discharge controller for controlling the discharge circuit. Such a discharge controller is programmed to control a rate at which the DC voltage decays from the first value to the second value. The discharge controller can control the rate manually, or automatically in response to receiving an instruction.

Among the embodiments of the apparatus are those in which the discharge circuit includes a capacitance in parallel with the discharge resistor and the discharge switch, and in which the discharge resistance is selected to discharge the bus capacitance quickly enough to prevent overheating at least one of the discharge resistor and the discharge switch when the discharge switch is closed.

Also included among the embodiments are those in which the inverter circuit includes parallel pairs of switching elements, each pair including a first switching element in series with a second switching element.

In some embodiments, the discharge circuit for causing the difference between the two values of DC voltage is sufficiently large to accommodate voltage transients resulting from activity of the inverter circuit.

In another aspect, the invention features an apparatus for reducing a voltage generated by a photovoltaic array that includes means for causing a DC voltage generated by a photovoltaic array to decay from a first value to a second value; and an inverter circuit for transforming an output voltage from the discharge circuit into an AC voltage.

In another aspect, the invention features a method for disabling and re-enabling an inverter circuit connected to a photovoltaic array. Such a method includes disabling an inverter circuit from interacting with the photovoltaic array; draining a voltage generated by the photovoltaic array from a first value to a second value; and after the voltage has reached the second value, re-enabling interaction between the inverter circuit and the photovoltaic array.

In some practices, draining a voltage comprises allowing current to flow through a resistance connected in parallel with the voltage generated by the photovoltaic array. Among these practices are those in which allowing current to flow comprises closing a switch in series with the resistance. Also among these practices are those that further include re-opening the switch, and those that further include clamping the voltage across the switch to a value equal to a concurrent voltage generated by the photovoltaic array.

In other practices, draining the voltage comprises causing a transition from the first value to the second value within a time interval selected to be short enough to avoid overheating circuit components.

Alternative practices also include receiving an instruction to re-enable the inverter circuit, and wherein draining the voltage is executed automatically in response to the instruction.

Practices also include those in which the second value is selected to be greater than an MPP operating voltage of the array, and those in which it is selected to be less than a maximum power point operating voltage of the photovoltaic array. Among those practices in which the second value is selected to be less than the maximum power point operating voltage are those that include detecting that the voltage has reached the second value, and waiting for a selected interval prior to enabling the interaction between the inverter circuit and the photovoltaic array.

These and other features of the invention will be apparent from the following detailed descriptions and the accompanying figures, in which:

DETAILED DESCRIPTION

Figure 1:
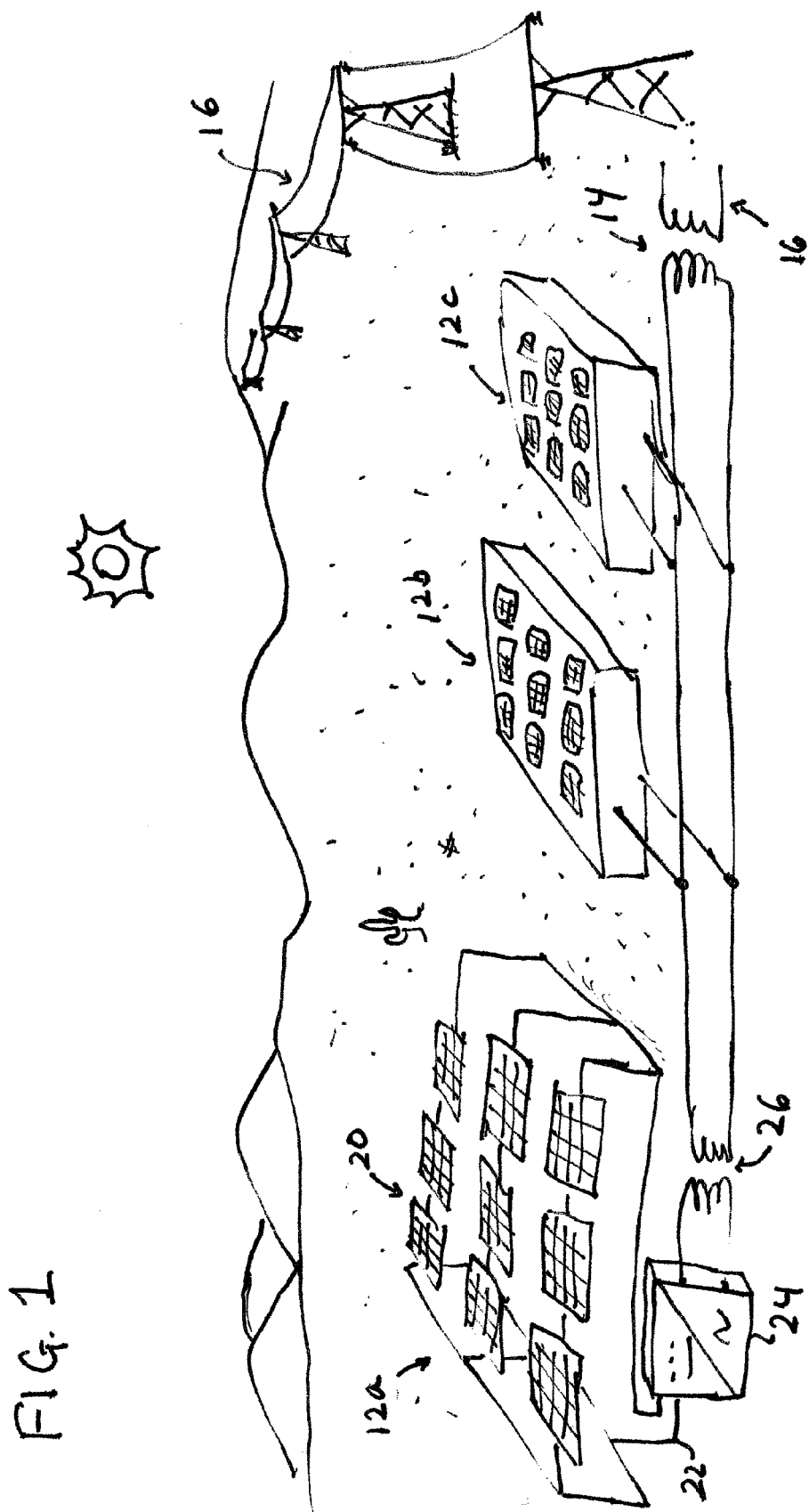
FIG. 1 is a diagram of a photovoltaic power plant.

FIG. 1 shows a typical photovoltaic power station 10 having one or more photovoltaic plants 12a-c that provide an AC voltage to a first transformer 14. The first transformer 14 increases this AC voltage and places the resulting high voltage output on a transmission line 16 connected to the utility grid.

The first transformer 14 typically receives an AC voltage on the order of 34.5 kV, and steps it up to an AC voltage between about 115 kV and 345 kV. However, in some embodiments, the first transformer 14 steps the voltage up to as low as 69 kV, or a voltage in excess of 345 kV.

A typical photovoltaic plant 12a includes a photovoltaic array 20 that, in response to solar irradiation, generates a DC voltage on an input bus 22 of a solar inverter system 24. The value of this voltage depends on the layout of individual solar panels, the amount of light, the electrical load, and the temperature. In typical utility scale applications under typical operating conditions, the output voltage is on the order of 750 volts.

The solar inverter system 24 converts the DC voltage into an AC voltage, which is then provided to a second transformer 26. For cases in which power is to be provided to a utility grid, the solar inverter system 24 is a grid-tie inverter.

The output of the second transformer 26, as well as outputs of corresponding transformers at other photovoltaic plants 12b-c, is then provided to the first transformer 14.

Figure 2:
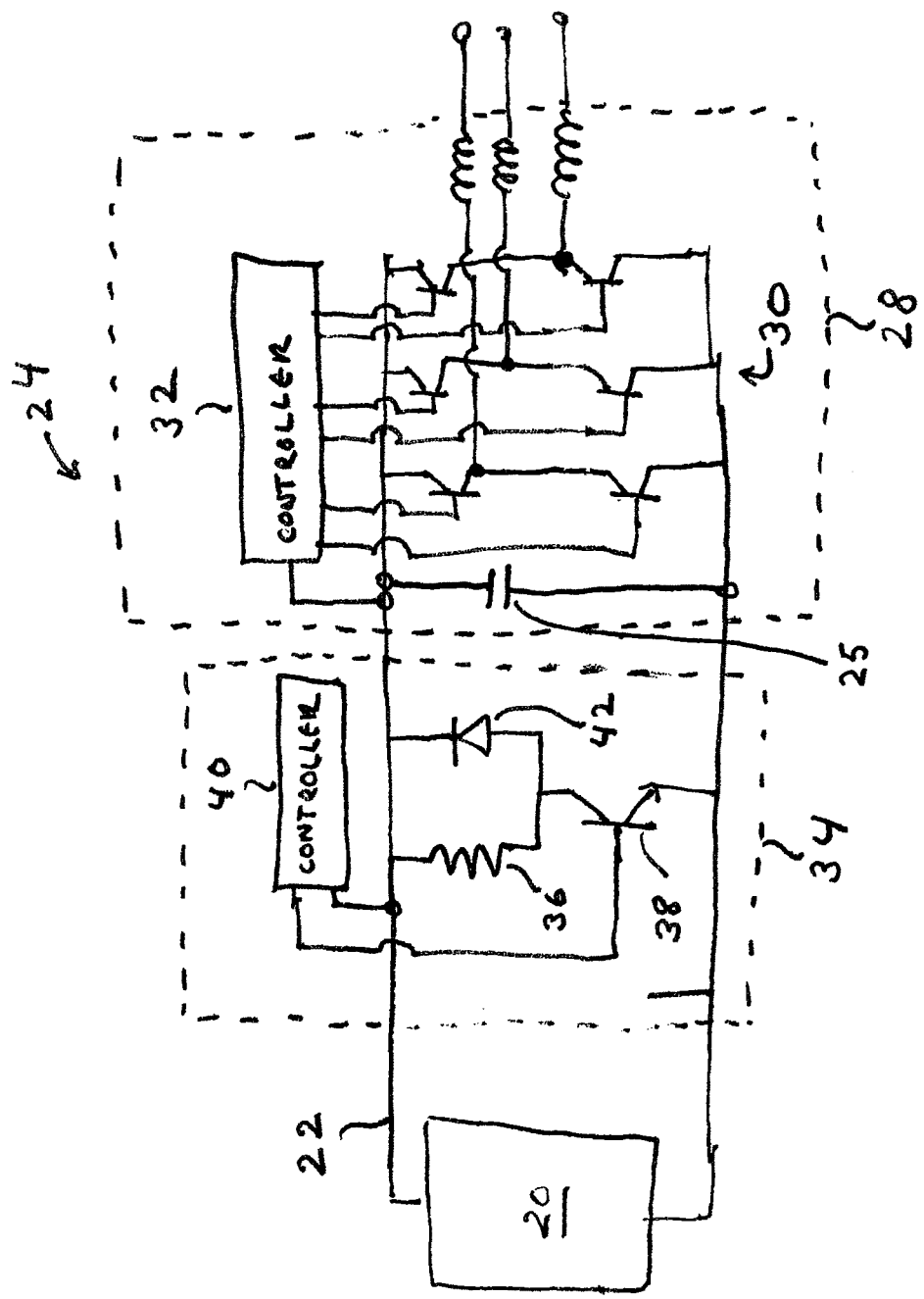
FIG. 2 is a solar inverter for use in the power plant of FIG. 1.

A typical solar inverter system 24, shown in FIG. 2, includes a discharge circuit 34 and an inverter circuit 28. The inverter circuit 28 includes a DC bus capacitor 25 in parallel with pairs of switching elements 30 that switch on and off in response to instructions from an operating controller 32. Each pair of switching elements 30 can be used to generate an AC signal. Thus, the three pairs of switching elements 30 shown can be used to generate a three-phase AC signal.

The switching elements 30 in an inverter circuit 28 used in a photovoltaic plant 12a are expected to handle high current loads. Suitable switching elements 30 are insulated gate bipolar transistors, or IGBTs.

The DC voltage on the input bus 22 depends on a number of factors, including the amount of sunlight falling on the photovoltaic array 20, the ambient temperature, the electrical load presented to the array 20, and the age and condition of the array 20. To some extent, the solar inverter system 24 controls the electrical load by adjusting the voltage across the bus 22. This affects the power transferred from the photovoltaic array 20 to the solar inverter system 24. One function of the operating controller 32 is to function as a maximum power point tracking device to maintain that voltage at a maximum power point.

In some cases, the switching elements 30 are held in an OFF, or open-circuit state, for example as a result of maintenance, in response to a fault, or any other time the inverter is disabled. When the solar inverter system 24 is disabled, interaction between the inverter circuit 28 and the photovoltaic array 20 ceases, and the voltage on the bus 22 can rise to a level in excess of the safe operating voltage associated with the inverter's switching elements 30.

To facilitate re-enabling the switching elements 30, the inverter includes a discharge circuit 34 in parallel with the inverter circuit 28. The discharge circuit 34 includes a discharge resistor 36 placed across the input bus 22, and a discharge switch 38 that selectively connects the discharge resistor 36 to ground in response to control signals provided by a discharge controller 40.

Figure 3:
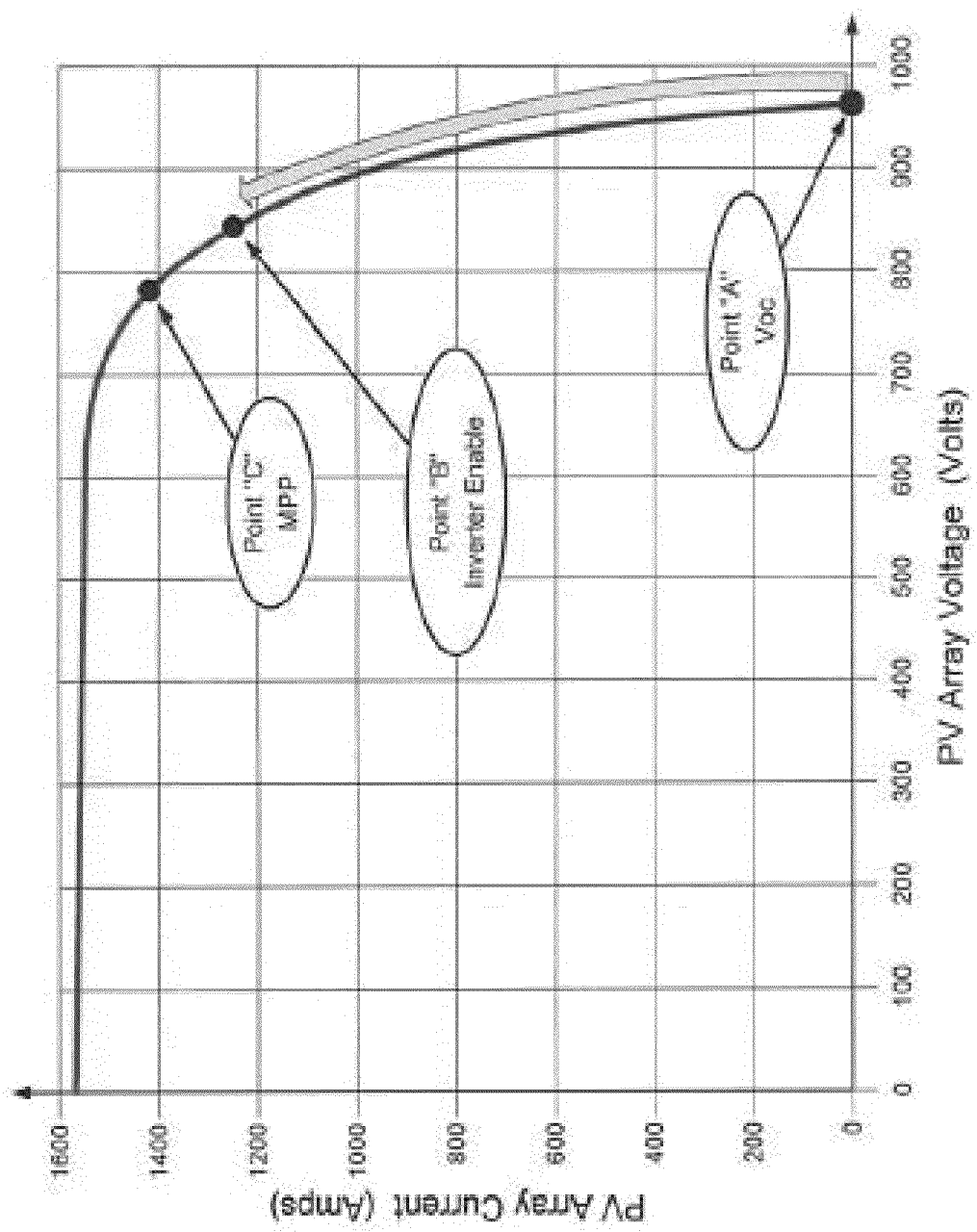
FIGS. 3 and 4 show two methods for traversing the V/I characteristic of a photovoltaic array from the photovoltaic power plant of FIG. 1

The start-up of the inverter circuit 28 is best understood in connection with FIG. 3, which shows the voltage/current characteristic of a typical photovoltaic array 20. In this example, the switching elements 30 are rated at 1200 V. However, because the switching elements 30 switch at high frequency (on the order of 1-6 kHz in a 1 MW inverter) a voltage spike arises across any parasitic inductances in the inverter circuit 28. To accommodate this voltage spike, the inverter circuit 28 is operated only when the bus voltage is less than 70%-75% of the switching element's rating. Thus, in the present example, the inverter circuit 28 should not be operated until the bus voltage falls to about 850 volts.

In the particular example shown in the figure, the open circuit bus voltage rises to 967 volts when the ambient temperature is 5 degrees Fahrenheit (−15 degrees Celsius). As a result, operation of the inverter circuit 28 should be delayed until the voltage is drained from 967 volts to approximately 850 volts.

When the inverter circuit is disabled, the open circuit voltage on the bus 22 may be too high to safely operate the inverter circuit 28, as seen at point "A" in the figure. Before the inverter circuit 28 can be re-enabled, the discharge controller 40 first closes the discharge switch 38. This causes the voltage to drop and the current to rise. When the voltage has dropped to a safe level (e.g. below 850V), shown as point "B" in FIG. 3, the inverter circuit 28 is re-enabled and the discharge controller 40 re-opens the discharge switch 38. The operating controller 32 then causes the voltage to settle at the maximum power point value, which is at point "C" in FIG. 3.

Figure 4:
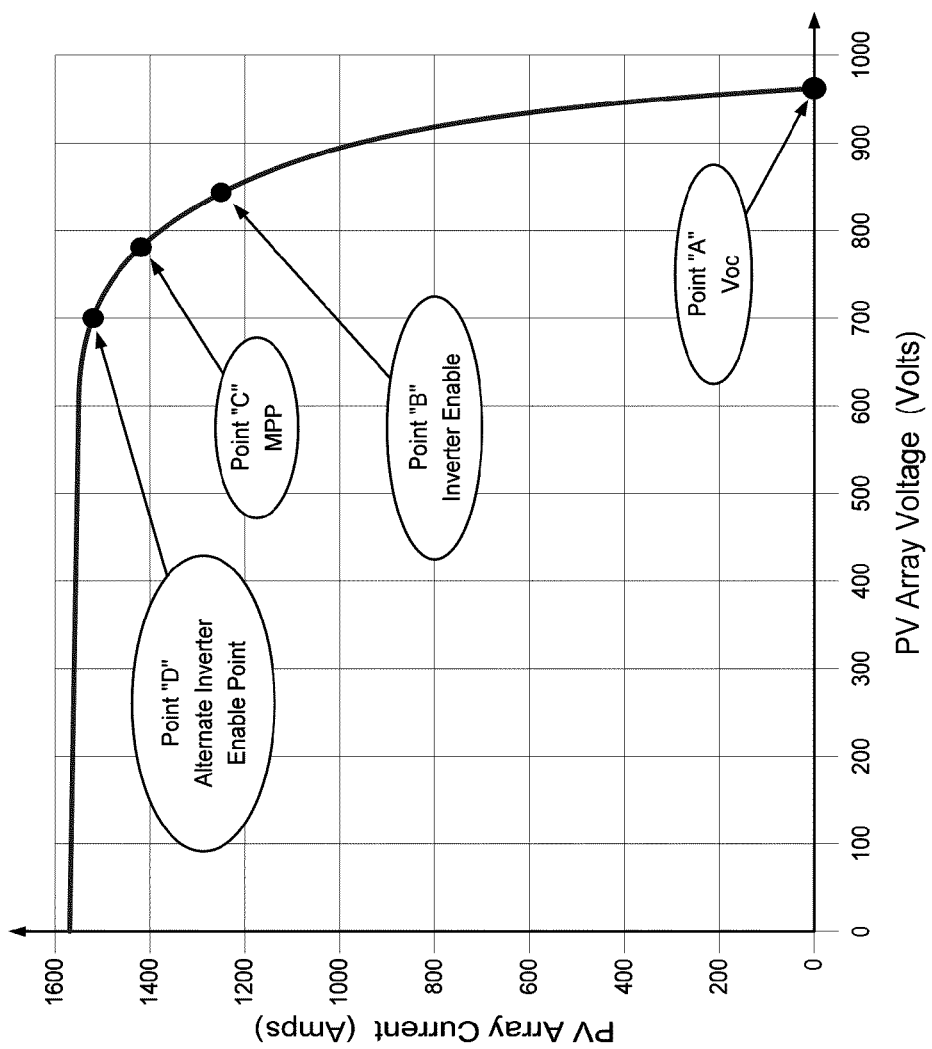

FIG. 4 shows the same voltage/current characteristic of FIG. 3 but with different operating points. These operating points are used to start the inverter circuit 28 during periods in which the ambient temperature is close to the minimum operating temperature of the switching elements 30 (for example, below −40 C). Under such conditions, the switching elements 30 should not be operated at the point "B" in FIG. 3 because of the risk of exceeding the breakdown voltage of the switching elements 30.

In the example of FIG. 4, the open circuit bus voltage has risen to 967 volts, as was the case in FIG. 3. However, in this case, operation of the inverter circuit 28 is delayed until the voltage is drained from 967 volts to about 700 volts (point "D"). This is done to avoid having voltage spikes within the switching elements 30 exceed the breakdown voltage of those elements 30.

The procedure for draining the voltage, and thereby moving from point "A" to point "D" in FIG. 4, is the same as that discussed in connection with FIG. 3. The discharge controller 40 first closes the discharge switch 38. This causes the voltage to drop and the current to rise. When the voltage has dropped to a safe level (e.g. to 700 V), shown as point "D" in FIG. 4, the inverter circuit 28 is re-enabled and the discharge controller 40 re-opens the discharge switch 38.

Once the discharge switch is re-opened, there are two options that can be carried out by the operating controller 32.

One option is to promptly cause the voltage to settle at the maximum power point value, which is at point "C" in FIG. 3. However, if the switching elements 30 have not yet warmed up enough, their breakdown voltage may be still be too low to accommodate voltage spikes.

A second option is to wait for a selected period to allow the switching elements 30 to warm up. During this warm up interval, the power output is reduced because the bus voltage is below the maximum power point voltage. After an interval that depends on the thermal design of the inverter circuit 28, the junction temperature of the switching elements 30 will have risen sufficiently to raise their breakdown voltages. At that point, the operating controller 32 can bring the operating voltage up to the maximum power point voltage.

The selected time interval before allowing the operating controller 32 to bring the voltage up to the maximum power point voltage (i.e. to begin traversing from point "D" to point "C" in FIG. 4) depends on such factors as the thermal design of the inverter circuit 28 and the ambient temperature. In some embodiments, a warm up interval between 10 and 90 seconds is necessary. In other embodiments, a temperature sensor can be provided to assist the operating controller 32 in determining when it is safe to begin raising the voltage.

A disadvantage of having to discharge all the way from point "A" to point "D" is that more energy is absorbed by the discharge resistor 36. In addition, the time required to carry traverse the voltage/current curve from point "A" all the way to point "D" is longer than that require to traverse it only up to point "B". As a result, the transient rating of all elements in the discharge circuit is necessarily higher.

The discharge controller 40 is configured to automatically carry out either one of the foregoing sequences in response to receiving an instruction to re-enable the inverter circuit 28. Thus, maintenance personnel providing such instructions would not have to be aware that the foregoing re-enablement procedure was taking place at all. The discharge controller 40 thus renders the foregoing re-enablement procedure transparent to maintenance personnel.

The discharge controller 40 can be configured in hardware, or as an ASIC programmed to carry out the foregoing procedure. It can also be implemented as a general purpose controller having a processor programmed to carry out the foregoing procedure. A controller programmed to carry out the foregoing procedure is clearly structurally different from a controller that has not been so programmed. For example, its memory stores instructions that are different from those of a controller not so programmed. These differences are manifested in voltages present at each memory location in a programmed controller that are in some cases different from those in corresponding memory locations in a controller not so programmed. These differing voltages provide tangible physically measurable evidence of such structural differences.

In general, the discharge resistor's resistance (discharge resistance) is selected to be low enough to quickly discharge the discharge capacitor 25, thereby reducing the bus voltage, while simultaneously absorbing the current flow from the PV array as the voltage drops. However, as a practical matter, the lower the discharge resistance becomes, the higher the discharge current will be. A high discharge current will mean that both the discharge resistor 36 and the discharge switch 38 must safely handle higher currents. This would increase component costs.

However, if the discharge time, i.e. the time required to reduce the voltage across the capacitor 25 to a safe level, is selected to be short enough, then the transient ratings of both the discharge resistor 36 and the discharge switch 38 can be relied upon to accommodate the high current that would momentarily flow through those elements.

Preferably, the discharge resistance is selected to minimize energy absorbed by the resistor 36 while still not exceeding the transient current ratings of the resistor 36 and the switch 38.

Alternatively, the discharge resistance can be low enough to quickly drain the bus voltage by causing a high current pulse that is nevertheless still within the transient current ratings of both the discharge resistor 36 and the discharge switch 38.

The voltage ratings of the discharge switch 38 and discharge resistor 36 can be the same as those of the switching elements 30. This is because by the time the discharge switch 38 is opened, the bus voltage will already be low enough so that any transients generated by opening the discharge switch 38 will, when added to the bus voltage, not exceed the maximum voltage rating of the switching elements 30.

In some cases, the discharge circuit 34 may have parasitic inductances that would generate additional voltage transients upon opening the discharge switch 38. To accommodate such transients, it is useful to provide a clamping diode 42 to clamp the voltage to the bus voltage.

In the example shown in FIG. 3, the time it takes to traverse the V/I curve from point "A" to point "B" is on the order of 100 ms. In general, the time required to traverse the V/I curve is transparent to the operator who re-enables the inverter circuit 28. Since the operator is not expected to disable and re-enable the inverter circuit 28 repeatedly in rapid succession, all components are expected to have sufficient time to cool down before the next re-enablement of the inverter circuit 28.

The discharge circuit 34 can be implemented as single elements within the solar inverter system 24. However, the discharge circuit 34 can also be implemented outside the solar inverter system 24. This feature is useful for retrofitting existing photovoltaic inverters.

In some cases, an inverter circuit 28 may have multiple banks of switching elements 30 operating in parallel. In such cases, it may be useful to provide a discharge circuit 34 for selected subsets of those banks of switching elements 30.

The discharge switch 38 can be implemented in a variety of ways. For example, the discharge switch 38 can be a junction transistor, an IGBT, an IGCT (integrated-gate commutated thyristor), a MOSFET (metal oxide silicon field effect transistor), or any similar device.

The foregoing devices and methods are particularly useful for photovoltaic arrays 20 since such arrays cannot easily be turned off. However, the devices and methods can be applied to any DC power source having an operating voltage that is lower than its open circuit voltage. The devices and methods are particularly advantageous when the gap between the operating voltage and the open circuit voltage is large, for example when the operating voltage is on the order of 76% of the open circuit voltage, and when the switching element voltage rating is only 10% to 20% above the open circuit voltage.

The foregoing methods and devices are also applicable in those cases in which a solar inverter system 24 having a particular rated voltage is to be used with a low power photovoltaic array 20 whose open circuit voltage is below the rated voltage by an amount this is smaller than the additional voltage arising from transients within the solar inverter system 24.

As described above, the voltage rating of the discharge switch 36 is equal to that of the switching elements 30 in the inverter circuit 28. In some applications, however, it may be desirable to have a discharge switch 38 with a voltage rating in excess of that of the switching elements 30. This might arise, for example, if the discharge switch 38 is not rated to be closed at the open circuit voltage.

Having described the invention, and a preferred embodiment thereof, what is claimed as new, and secured by Letters Patent is:

1. An apparatus for harvesting solar power, said apparatus comprising a photovoltaic array for generating a DC voltage, a discharge circuit having an input for receiving said DC voltage from said photovoltaic array, an output on which is present an output DC voltage that decays in response to activity of said discharge circuit from a first value equal to said DC voltage from said photovoltaic array, said first value being in excess of a maximum power point operating voltage of said photovoltaic array and in excess of a safe operating voltage for said inverter circuit to a second value being a safe operating voltage for said inverter circuit and one of greater than the maximum power point operating voltage and less than the maximum power point operating voltage of said photovoltaic array, and a discharge switch for discharging said discharge circuit, an inverter circuit directly connected in parallel with said discharge circuit such that said output DC voltage of said discharge circuit is an input voltage of said inverter circuit, said inverter circuit being configured to resume interaction with said photovoltaic array after a cessation of interaction between said inverter circuit and said photovoltaic array, and following resumption, to resume transforming an output voltage from said discharge circuit into an AC voltage when said output DC voltage of said discharge circuit has completed decaying from said first value to said second value, and a discharge controller for controlling said discharge circuit, said discharge controller being programmed to control decay of said DC voltage by closing said discharge switch until said second value is reached and to re-open said discharge switch after resumption of interaction between said inverter circuit and said photovoltaic array; and said discharge controller being programmed to control said DC voltage present at the input terminal of said inverter to settle from the second value to the maximum power point operating voltage.

2. The apparatus of claim 1, wherein said discharge circuit comprises a discharge resistor, and wherein said discharge switch is in series with the discharge resistor, wherein said discharge circuit is in parallel with said inverter circuit.

3. The apparatus of claim 2, wherein said discharge switch has a voltage rating equal to a voltage rating of said inverter circuit.

4. The apparatus of claim 2, wherein said discharge circuit further comprises a clamping diode in parallel with said discharge resistor.

5. The apparatus of claim 2, wherein said discharge circuit comprises a bus capacitance in parallel with said discharge resistor and said discharge switch, and wherein said discharge resistor is selected to such that a current pulse is between a transient rating of said discharge resistor and a steady-state rating.

6. The apparatus of claim 2, wherein said discharge circuit comprises a bus capacitance in parallel with said discharge resistor and said discharge switch, and wherein said discharge resistance is selected cause a discharge time that is short enough so that transient ratings of both said discharge resistor and said switch can be relied upon to accommodate a current that momentarily flows through said discharge resistor and said discharge switch during said discharge time.

7. The apparatus of claim 2, wherein said discharge resistor has a discharge resistance selected to minimize energy absorbed by said discharge resistor subject to a constraint that transient current ratings of said discharge resistor and said discharge switch not be exceeded.

8. The apparatus of claim 1, wherein said inverter circuit comprises a plurality of parallel pairs of switching elements, each pair including a first switching element in series with a second switching element.

9. The apparatus of claim 1, wherein a difference between said first value and said second value is sufficiently large to accommodate voltage transients resulting from activity of the inverter circuit.

10. The apparatus of claim 1, wherein said second value is 76% of said first value.

11. The apparatus of claim 1, wherein the discharge controller is configured to begin the decay automatically in response to detecting that said first value is in excess of a safe operating voltage for said inverter circuit and to end said decay automatically upon detecting that said second value has reached a safe operating voltage for said inverter circuit.

12. A method for protecting an inverter circuit from an unsafe operating voltage generated by a photovoltaic array, said method comprising: causing cessation of interaction between an inverter circuit and said photovoltaic array, after causing cessation of interaction between said inverter circuit and said photovoltaic array, determining that a voltage present at an output terminal of said photovoltaic array is at a first voltage, said first voltage being in excess of a maximum power point operating voltage of said photovoltaic array and in excess of a safe operating voltage for said inverter circuit, causing the voltage present at an input terminal of said inverter circuit to decrease from a first value equivalent to said first voltage to a second value, said second value being a safe operating voltage for said inverter circuit and one of greater than the maximum power point operating voltage and less than the maximum power point operating voltage of said photovoltaic array and after said voltage present at said input terminal of said inverter circuit has reached said second value, re-enabling interaction between said inverter circuit and said photovoltaic array; and causing the voltage present at the input terminal of said inverter to settle from the second value to the maximum power point operating voltage.

13. The method of claim 12, wherein causing a voltage present at an input terminal of said inverter circuit to decrease from said first value to a second value comprises allowing current to flow through a discharge resistance connected in parallel with said voltage generated by the photovoltaic array.

14. The method of claim 13, wherein allowing current to flow comprises closing a discharge switch in series with said discharge resistance.

15. The method of claim 14, further comprising clamping said voltage across said discharge switch to a value equal to a voltage generated by said photovoltaic array.

16. The method of claim 14, further comprising receiving an instruction to resume interaction between said inverter circuit and said photovoltaic array and to re-open said discharge switch, and wherein causing a voltage present at an input terminal of said inverter circuit to decrease from said first value to a second value is executed automatically in response to the instruction.

17. The method of claim 12, wherein causing a voltage present at an input terminal of said inverter circuit to decrease from said first value to a second value comprises causing a transition from said first value to said second value within a time interval selected to be short enough to avoid overheating circuit components.

18. The method of claim 12, further comprising detecting that said voltage has reached said second value, and waiting for a selected interval prior to resuming interaction between said inverter circuit and said photovoltaic array.

* * * * *